US009990962B2

(12) United States Patent
Kim

(10) Patent No.: US 9,990,962 B2
(45) Date of Patent: Jun. 5, 2018

(54) DATA SENSE AMPLIFIER AND A MEMORY DEVICE WITH OPEN OR FOLDED BIT LINE STRUCTURE

(71) Applicant: SK hynix Inc., Gyeonggi-do (KR)

(72) Inventor: Dong-Keun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 14/705,604

(22) Filed: May 6, 2015

(65) Prior Publication Data

US 2016/0163359 A1 Jun. 9, 2016

(30) Foreign Application Priority Data

Dec. 8, 2014 (KR) ........................ 10-2014-0174705

(51) Int. Cl.
| G11C 7/06 | (2006.01) |
| G11C 7/12 | (2006.01) |
| G11C 5/06 | (2006.01) |
| G11C 5/02 | (2006.01) |
| G11C 7/08 | (2006.01) |
| G11C 11/4091 | (2006.01) |
| G11C 11/4094 | (2006.01) |
| G11C 11/4097 | (2006.01) |

(52) U.S. Cl.
CPC ................ *G11C 5/06* (2013.01); *G11C 5/025* (2013.01); *G11C 7/065* (2013.01); *G11C 7/08* (2013.01); *G11C 7/12* (2013.01); *G11C 11/4091* (2013.01); *G11C 11/4094* (2013.01); *G11C 11/4097* (2013.01)

(58) Field of Classification Search
CPC ...................................................... G11C 7/12
USPC ...................................................... 365/72, 208
See application file for complete search history.

(56) References Cited

U.S. PATENT DOCUMENTS

| 4,947,376 A | * | 8/1990 | Arimoto | ............. G11C 11/4091 |
| | | | | 327/51 |
| 5,128,896 A | * | 7/1992 | Yamada | ................. G11O 5/063 |
| | | | | 365/190 |
| 5,412,605 A | * | 5/1995 | Ooishi | ...................... G11C 7/06 |
| | | | | 365/203 |
| 5,539,701 A | * | 7/1996 | Shimizu | .............. G11C 11/4091 |
| | | | | 365/202 |
| 5,566,116 A | * | 10/1996 | Kang | .................. G11C 11/4091 |
| | | | | 365/149 |

(Continued)

FOREIGN PATENT DOCUMENTS

| JP | EP 1039471 A2 * | 9/2000 | ................ G11C 5/14 |
| KR | 20100083587 A * | 7/2010 | ............. G11C 5/025 |

(Continued)

*Primary Examiner* — Anthan Tran
*Assistant Examiner* — Mushfique Siddique
(74) *Attorney, Agent, or Firm* — IP & T Group LLP

(57) ABSTRACT

A data sense amplifier may include: first and second external nodes, wherein a potential difference occurs between the first and second external nodes when a memory cell is selected; an amplification unit suitable for generating and amplifying a potential difference between first and second nodes in response to the potential difference between the first and second external nodes; and a switching unit suitable for electrically coupling the first and second external nodes to the first and second nodes, respectively, after a predetermined time elapses from when the memory cell is selected.

3 Claims, 10 Drawing Sheets

(56) References Cited

U.S. PATENT DOCUMENTS

| | | | | | |
|---|---|---|---|---|---|
| 5,701,268 | A * | 12/1997 | Lee | G11C 7/06 | 365/190 |
| 5,768,204 | A * | 6/1998 | Muraoka | G11C 7/065 | 365/149 |
| 5,949,729 | A * | 9/1999 | Suyama | G11C 7/065 | 365/174 |
| 6,104,655 | A * | 8/2000 | Tanoi | G11C 11/4091 | 365/205 |
| 6,205,068 | B1 * | 3/2001 | Yoon | G11C 7/12 | 365/203 |
| 6,252,431 | B1 * | 6/2001 | Hosokawa | G11C 7/065 | 327/57 |
| 6,331,959 | B1 * | 12/2001 | Hirota | G11C 7/06 | 365/203 |
| 6,347,057 | B1 * | 2/2002 | Matsui | G11C 7/06 | 365/203 |
| 6,529,434 | B2 * | 3/2003 | Kitamoto | G11C 7/1051 | 365/207 |
| 6,618,307 | B2 * | 9/2003 | Wickman | G11C 7/065 | 365/204 |
| 6,643,214 | B2 * | 11/2003 | Taito | G11C 7/1048 | 365/189.05 |
| 7,266,030 | B2 * | 9/2007 | Do | G11C 7/065 | 365/145 |
| 8,339,872 | B2 * | 12/2012 | Yun | G11C 11/4091 | 365/189.11 |
| 8,964,439 | B2 * | 2/2015 | Nagata | G11C 7/12 | 365/203 |
| 9,019,787 | B2 * | 4/2015 | Matsumoto | G11C 5/063 | 365/203 |
| 9,117,545 | B1 * | 8/2015 | Kim | G11C 11/4091 | |
| 2005/0248672 | A1 * | 11/2005 | Kim | G11C 7/12 | 365/203 |
| 2005/0249003 | A1 * | 11/2005 | Kim | G11C 7/1048 | 365/205 |
| 2007/0070711 | A1 * | 3/2007 | Kim | G11C 7/06 | 365/189.16 |
| 2007/0070755 | A1 * | 3/2007 | Kim | G11C 7/06 | 365/208 |
| 2007/0201290 | A1 * | 8/2007 | Kang | G11C 7/065 | 365/205 |
| 2008/0025113 | A1 * | 1/2008 | Kitagawa | G11C 7/067 | 365/189.09 |
| 2008/0117700 | A1 * | 5/2008 | Nakamura | G11C 11/4094 | 365/205 |
| 2008/0205185 | A1 * | 8/2008 | Shim | G11C 11/4094 | 365/230.03 |
| 2009/0027985 | A1 * | 1/2009 | Oka | G11C 11/4091 | 365/205 |
| 2009/0303825 | A1 * | 12/2009 | Kim | G11C 8/12 | 365/230.03 |
| 2010/0172198 | A1 * | 7/2010 | Gautam | G11C 7/065 | 365/203 |
| 2010/0182860 | A1 * | 7/2010 | Chang | G11C 11/4091 | 365/203 |
| 2010/0238740 | A1 * | 9/2010 | Matsuoka | G11C 11/4076 | 365/189.05 |
| 2010/0302878 | A1 * | 12/2010 | Kang | G11C 7/08 | 365/189.09 |
| 2011/0075498 | A1 * | 3/2011 | Song | G11C 29/12 | 365/201 |
| 2011/0141830 | A1 * | 6/2011 | Chi | G11C 7/065 | 365/189.11 |
| 2011/0292709 | A1 * | 12/2011 | Takayama | G11C 7/08 | 365/72 |
| 2012/0039143 | A1 * | 2/2012 | Katoch | G11C 11/4091 | 365/207 |
| 2012/0314510 | A1 * | 12/2012 | Ikeda | G11C 7/1048 | 365/189.05 |
| 2013/0128681 | A1 * | 5/2013 | Kim | G11C 11/406 | 365/207 |
| 2014/0104971 | A1 * | 4/2014 | Takahashi | G11C 7/065 | 365/203 |
| 2015/0053775 | A1 * | 2/2015 | Kang | H01L 27/105 | 235/492 |
| 2015/0063012 | A1 * | 3/2015 | Jung | G11C 7/06 | 365/158 |
| 2015/0071014 | A1 * | 3/2015 | Park, II | G11C 7/1078 | 365/191 |
| 2015/0124543 | A1 * | 5/2015 | Lee | G11C 11/4094 | 365/202 |
| 2015/0155015 | A1 * | 6/2015 | Park | G11C 7/12 | 365/189.11 |
| 2015/0179249 | A1 * | 6/2015 | Park, II | G11C 11/40615 | 365/207 |
| 2015/0262650 | A1 * | 9/2015 | Okahiro | G11C 11/4091 | 365/189.011 |
| 2016/0078919 | A1 * | 3/2016 | Han | G11C 11/4091 | 365/207 |
| 2016/0093353 | A1 * | 3/2016 | Jung | G11C 11/1673 | 365/158 |
| 2016/0163364 | A1 * | 6/2016 | Lee | G11C 7/12 | 365/189.11 |
| 2016/0163375 | A1 * | 6/2016 | Kim | G11C 11/4091 | 365/208 |
| 2016/0307618 | A1 * | 10/2016 | Kim | G11C 11/4091 | |
| 2017/0236573 | A1 * | 8/2017 | Kim | G11C 7/065 | 365/189.11 |

FOREIGN PATENT DOCUMENTS

| | | | |
|---|---|---|---|
| KR | 20100100132 A | * | 9/2010 |
| KR | 1020110000141 | | 1/2011 |
| KR | 101301281 | | 8/2013 |

* cited by examiner

DATA SENSE AMPLIFIER AND A MEMORY DEVICE WITH OPEN OR FOLDED BIT LINE STRUCTURE

CROSS-REFERENCE TO RELATED APPLICATIONS

The present application claims priority of Korean Patent Application No. 10-2014-0174705 filed on Dec. 8, 2014, which is incorporated herein by reference in its entirety.

BACKGROUND

1. Field

This patent document relates to a data sense amplifier and a memory device including the same.

2. Description of the Related Art

Memory devices read and write data according to commands from a host. The basic unit for storing data is a memory cell. One memory cell includes one capacitor to store one-bit of data. In order to read the data stored in the capacitor and transmit the read data externally, the memory device has to accurately determine a logic level of the data stored in the memory cell. For this operation, memory devices include bit line sense amplifiers to amplify the data stored in the capacitor.

FIG. 1 is a diagram illustrating a bit line sense amplifier and peripheral components thereof.

Referring to FIG. 1, the bit line sense amplifier 110 may be coupled to a bit line BL and a bit fine bar BLB and memory cells MC1 and MC2 may be arranged at positions where the bit line BL and the bit line bar BLB intersect word lines WL1 and WL2, respectively. The memory cells MC1 and MC2 may include cell transistors T1 and T2 and cell capacitors C1 and C2, respectively.

An operation of the bit line sense amplifier 110 will be described as follows.

First, when the word line WL1 is activated to select the memory cell MC1, the cell transistor T1 is turned on, and charge sharing occurs between the bit line BL and the cell capacitor C1. The charge sharing may cause a potential difference between the bit line BL and the bit line bar BLB, and the bit line sense amplifier 110 may amplify the potential difference between the bit line BL and the bit line bar BLB. To amplify the potential, the bit line sense amplifier 110 may include cross-coupled inverters I1 and I2 which are driven through a pull-up power supply voltage RTO and a pull-down power supply voltage SB.

An equalizing unit 120 may equalize voltages of the bit line and bit line bar BL and BLB to a precharge voltage VBLP during a period in which an equalizing signal BLEQ is activated.

FIG. 2 is a diagram illustrating cell mats 210 and 220 and amplification units 230 to 250 of a memory device.

Referring to FIG. 2, each of the cell mats 210 and 220 may include a plurality of word lines WL, a plurality of bit lines BL and BLB, and a plurality of memory cells MC coupled between the word lines WL and the bit lines BL. Each of the amplification units 230 to 250 may include a plurality of bit line sense amplifiers BLSA. The bit line sense amplifiers BLSA of FIG. 2 may be configured in the same manner as the bit line sense amplifier of FIG. 1.

When the size of the cell mats 210 and 220 is increased or, particularly, when the length of the bit lines BL and BLB is increased, a larger number of memory cells MC may be integrated into the cell mats 210 and 220. However, when the length of the bit lines BL and BLB is increased, the capacitance of parasitic capacitors existing in the bit lines BL and BLB may also increase.

On the other hand, as the integration degree and capacity of the memory device are increased, the size of the cell capacitors is reduced. Thus, the capacitance of the cell capacitor decreases. That is, the quantity of charge that can be stored in each cell capacitor is reduced. When the capacitance of the cell capacitor decreases and the capacitance of the bit line increases, due to the high integration, a considerable amount of time may be required for increasing a potential difference between the bit lines BL and BLB to a predetermined level or more through charge sharing between the cell capacitor and the bit line, and the potential difference may be reduced. Accordingly, the number of memory cells integrated in the cell mat has to be decreased to reduce the length of the bit lines BL and BLB, thereby reducing the capacitance of the bit line.

FIG. 3 is a diagram for describing a phenomenon which occurs when the length of bit lines included in a cell mat is reduced.

In FIG. 3, the reference numeral '310' indicates an example before the length of the bit lines is reduced, and the reference numeral '320' indicates an example after the length of the bit lines is reduced. Suppose that the length of the bit lines in example 320 is reduced to a half of the length of the bit lines in example 310. Furthermore, suppose that the number of integrated memory cells is proportional to the lengths of the cell mats MT1 and MT2, that is, the lengths of the bit lines.

Referring to FIG. 3, the length of the cell mat MT2 in example 320 is reduced to half of the length of the cell mat MT1 in example 310. Thus, in example 320, the number of cell mats required for integrating the same number of memory cells as example 310 is two times larger than in example 310. FIG. 3 illustrates that two cell mats MT1 are provided in example 310 and four cell mats MT2 are provided example 320.

In order to amplify data of the cell mats MT1 or MT2, amplification units SA have to be arranged between the respective cell mats MT1 or MT2 and outside the cell mats MT1 or MT2. Thus, example 310 requires three amplification units SA, and example 320 requires five amplification units SA. Therefore, the area occupied by one amplification unit SA is equal in examples 310 and 320. Thus, in example 320, the area required for integrating the same number of memory cells is larger than in example 310.

SUMMARY

Various embodiments are directed to a data sense amplifier and a memory device which are capable of amplifying data of a bit line pair when a potential difference between the bit line pair is sufficiently secured after charge sharing between a bit line and a cell capacitor, thereby preventing errors due to a reduction in size of cell capacitors while increasing integration of cell mats.

In an embodiment, a data sense amplifier may include: first and second external nodes, wherein a potential difference occurs between the first and second external nodes when a memory cell is selected; an amplification unit suitable for generating and amplifying a potential difference between first and second nodes in response to the potential difference between the first and second external nodes; and a switching unit suitable for electrically coupling the first and second external nodes to the first and second nodes, respectively, after a predetermined time elapses from when the memory cell is selected.

In an embodiment, a memory device may include: a plurality of word lines; a plurality of bit line pairs, each including first and second bit lines; a plurality of memory cells, each corresponding to one word line and one bit line among the plurality of word lines and the plurality of bit line pairs, and electrically coupled to the corresponding bit line when the corresponding word line is activated; and one or more bit line sense amplifiers, each corresponding to one bit line pair and suitable for generating and amplifying a potential difference between first and second nodes in response to a potential difference between the corresponding bit line pair when a word line is activated, and electrically coupling the first and second nodes to the first and second bit lines of the corresponding bit line pairs, respectively, after a predetermined time elapses from when the word line is activated.

In an embodiment, a data sense amplifier may include: first and second nodes, wherein a potential difference occurs between the first and second nodes when a memory cell is selected; a first amplification unit suitable for amplifying a potential difference between the first and second nodes by a first driving of the first and second nodes in response to the potential difference between the first and second nodes; a switching unit suitable for electrically coupling the first and second nodes to third and fourth nodes, respectively, after a predetermined time elapses from when the memory cell is selected; and a second amplification unit suitable for amplifying the potential difference between the first and second nodes by a second driving of the third and fourth nodes in response to the potential difference between the first and second nodes, when the first and second nodes are electrically coupled to the third and fourth nodes.

In an embodiment, a memory device may include: a plurality of word lines; a plurality of bit line pairs, each including first and second bit lines; a plurality of memory cells, each corresponding to one word line and one bit line among the plurality of word lines and the plurality of bit lines pairs, and electrically coupled to the corresponding bit line when the corresponding word line is activated; and a plurality of bit line sense amplifiers, each corresponding to one bit line pair and suitable for amplifying a potential difference between the corresponding bit line pair by a first driving of the corresponding bit line pair in response to the potential difference between the corresponding bit line pair when a word line is activated, and amplifying the potential difference between the corresponding bit line pair by the first driving and a second driving of the corresponding bit line pair in response to the potential difference between the corresponding bit line pair, after a predetermined time elapses from when the word line is activated.

In an embodiment, a memory device may include: a plurality of word lines; a plurality of bit line pairs, each comprising first and second bit lines; a plurality of memory cells, each corresponding to one word line and one bit line among the plurality of word lines and the plurality of bit lines pairs, and electrically coupled to the corresponding bit line when the corresponding word line is activated; and a plurality of bit line sense amplifiers, each corresponding to one bit line pair and suitable for amplifying a potential difference between the corresponding bit line pair by a first driving of the corresponding bit line pair in response to the potential difference between the corresponding bit line pair when a word line is activated, and amplifying the potential difference between the corresponding bit line pair by the first driving and a second driving of the corresponding bit line pair in response to the potential difference between the corresponding bit line pair, after a predetermined time elapses from when the word line is activated.

The potential difference between the bit line pair may occur from when the word line is activated.

The first driving may include a pull-up driving, and the second driving comprises a pull-down driving.

The first driving may include a pull-down driving, and the second driving comprises a pull-up driving.

The memory device may further include: an equalizing unit suitable for equalizing voltages of the first and second bit lines to a precharge voltage during a precharge period.

DETAILED DESCRIPTION

Figure 1:
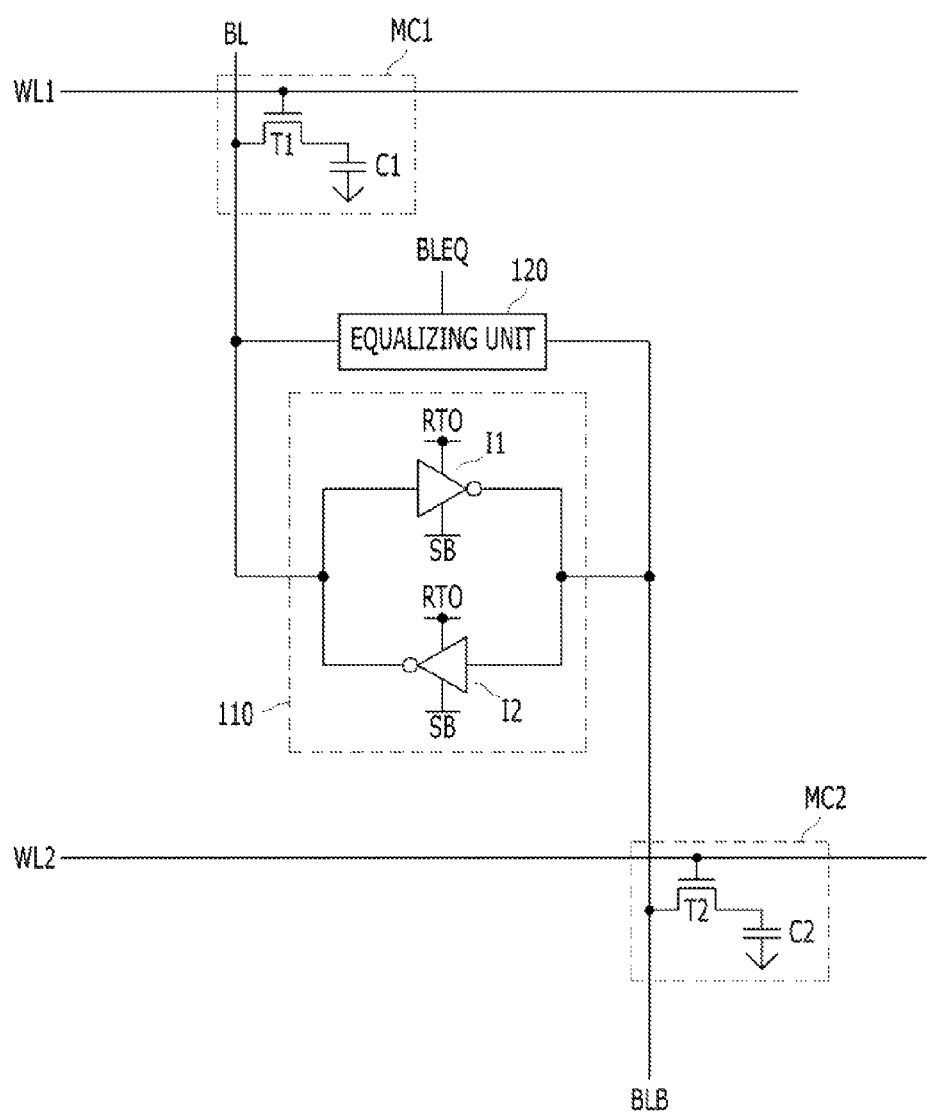
FIG. 1 is a diagram illustrating a bit line sense amplifier and peripheral components thereof.
Figure 2:
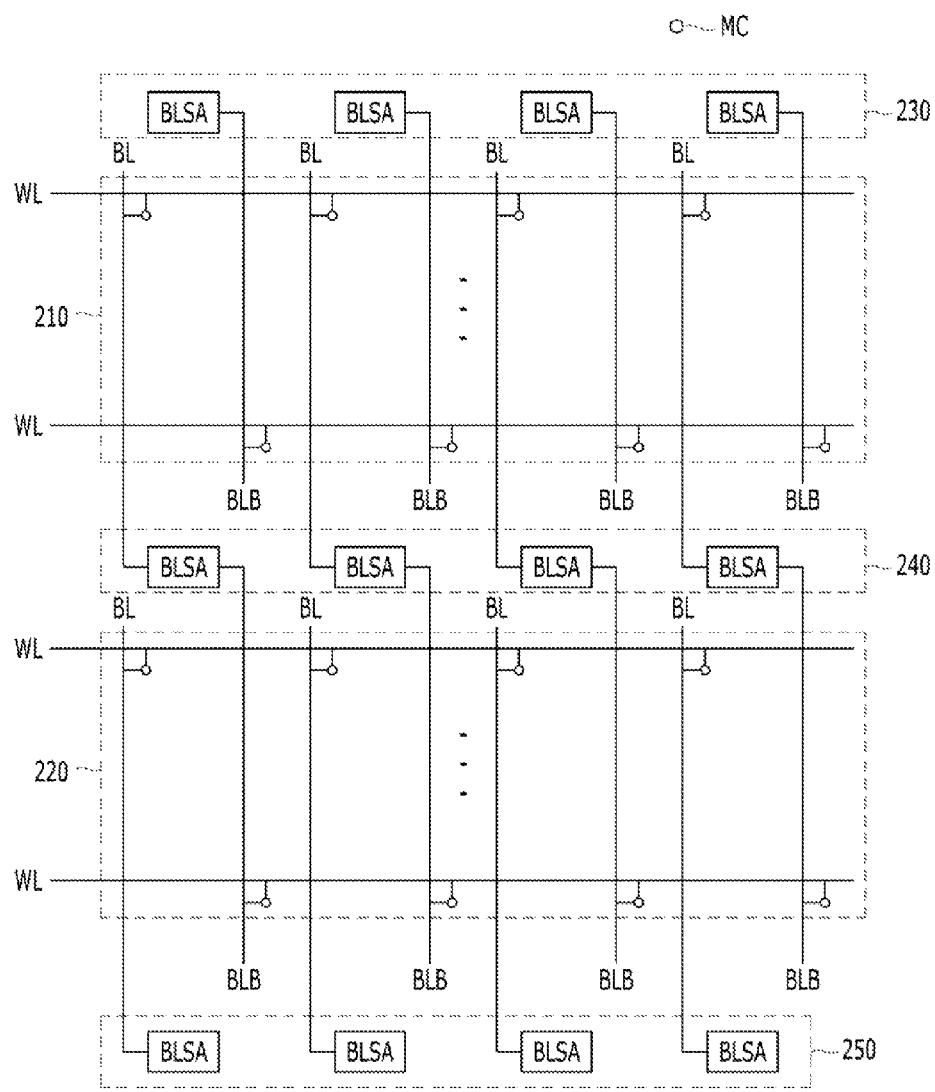
FIG. 2 is a diagram illustrating cell mats and amplification units of a memory device.
Figure 3:
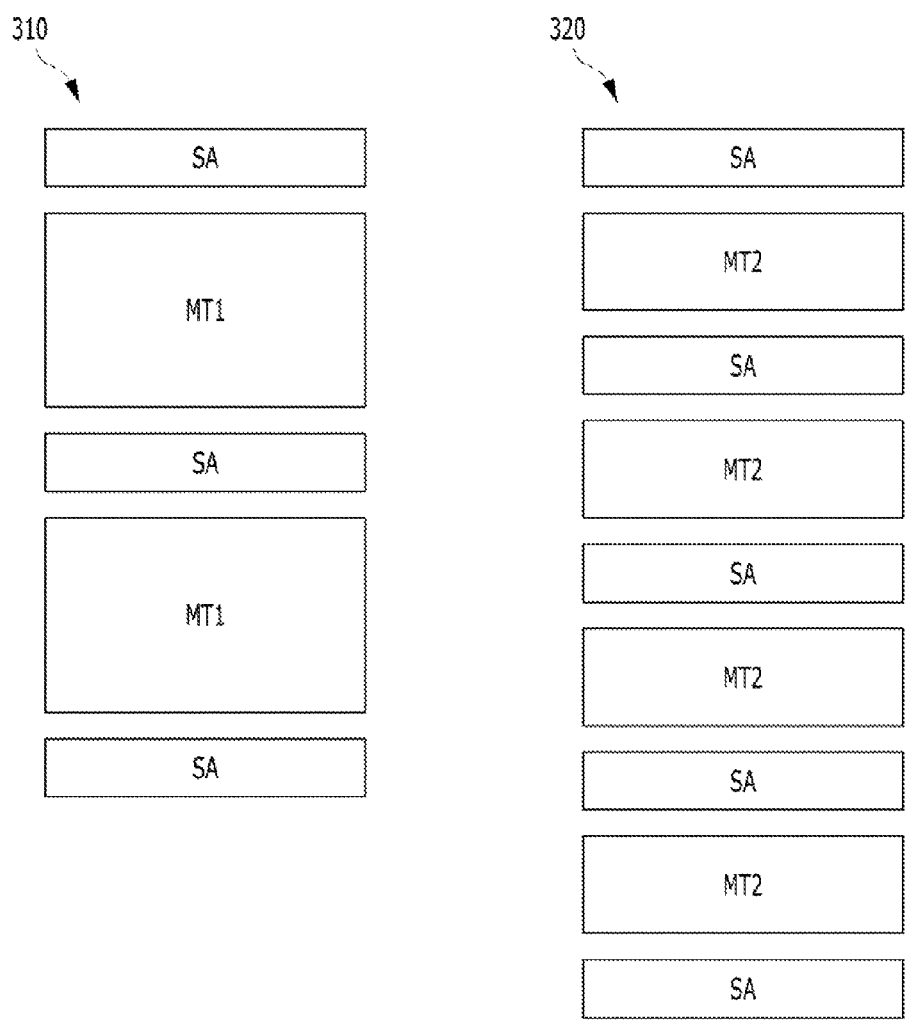
FIG. 3 is a diagram for describing a phenomenon that occurs when the length of bit lines included in a cell mat is reduced.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereafter, an example in which a data sense amplifier and a memory device including the same in accordance with an embodiment of the present invention are applied to an open bit line structure will be described. However, the data sense amplifier and the memory device in accordance with the embodiment of the present invention may be applied in the same manner to a folded bit line structure. For reference, the memory device may be classified into the folded bit line structure and the open bit line structure depending on how the bit lines are arranged. In the folded bit line structure, a bit line and a bit line bar are disposed in the same cell mat on the basis of a sense amplifier. In the open bit line structure, a bit line and a bit line bar are disposed in a different cell mat on the basis of a sense amplifier.

Figure 4:
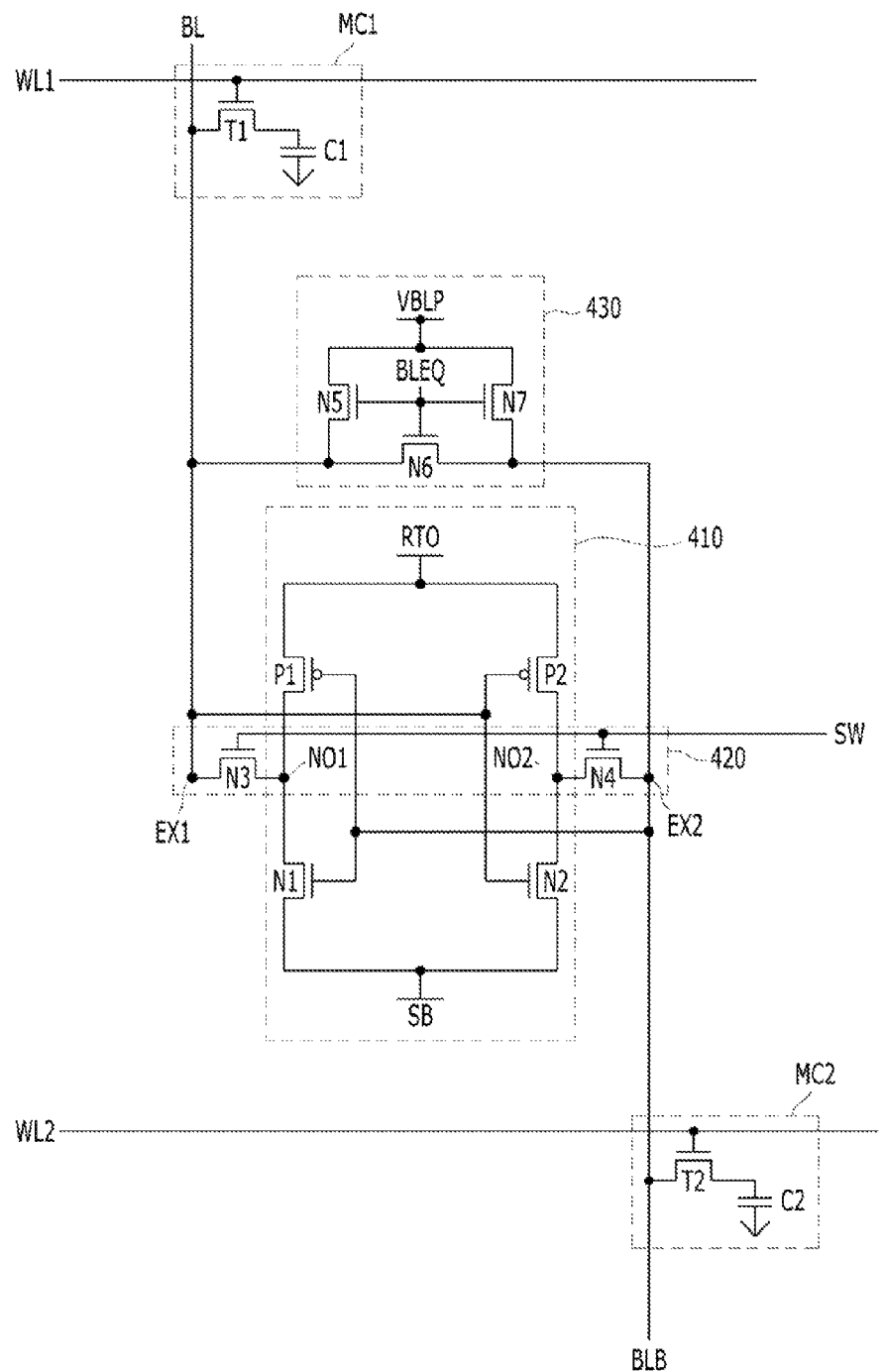
FIG. 4 is a configuration diagram of a data sense amplifier in accordance with an embodiment of the present invention.

FIG. 4 is a configuration diagram of a data sense amplifier in accordance with an embodiment of the present invention.

Referring to FIG. 4, the data sense amplifier may include first and second external nodes EX1 and EX2, an amplification unit 410, and a switching unit 420. The first external node EX1 may be coupled to a bit line BL, and the second external node EX2 may be coupled to a bit line bar BLB. Thus, voltages of the bit line BL and the first external node EX1 may be equal to each other, and voltages of the bit line bar BLB and the second external node EX2 may be equal to each other.

Memory cells MC1 and MC2 may correspond to the bit line and bit line bar BL and BLB and word lines WL1 and WL2, respectively. That is, each of the memory cells MC1 and MC2 may correspond to one word line and one bit line among the word lines WL1 and WL2 and the bit line and bit line bar BL and BLB. The memory cells MC1 and MC2 may include cell transistors T1 and T2 and cell capacitors C1 and C2, respectively.

When a word line is activated, a memory cell coupled to the activated word line may be selected. When the word line WL1 is selected, the memory cell MC1 corresponding to the bit line BL may be selected, and when the word line WL2 is selected, the memory cell MC2 corresponding to the bit line bar BLB may be selected. Hereafter, an example in which the word line WL1 is activated and the memory cell MC1 coupled to the bit line BL is selected will be described.

When the memory cell MC1 is selected, the cell transistor T1 of the selected memory cell MC1 may be turned on, and the cell capacitor C1 of the selected memory cell MC1 and the bit line BL may be electrically coupled to each other. Then, charge sharing may occur between the cell capacitor C1 and the bit line BL, and the voltage of the bit line BL may change.

Before the memory cell MC1 is selected, the voltages of the bit line and bit line bar BL and BLB may be equalized to a precharge voltage VBLP by the equalizing unit 430. Thus, from when the memory cell MC1 is selected, a potential difference may occur between the bit line BL and the bit line bar BLB. When the data of the memory cell MC1 is high data, the voltage of the bit line BL may increase, and when the data of the memory cell MC1 is low data, the voltage of the bit line BL may decrease.

When a pull-up power supply voltage RTO and a pull-down power supply voltage SB are supplied to a pull-up power supply voltage (RTO) terminal and a pull-down power supply voltage (SB) terminal, respectively, the amplification unit 410 may generate and amplify a potential difference between first and second nodes NO1 and NO2 in response to the potential difference between the bit line and bit line bar BL and BLB. The amplification unit 410 may decrease the voltage of the second node NO2 when the voltage of the bit line BL increases, and increase the voltage of the second node NO2 when the voltage of the bit line BL decreases. Thus, when the data of the memory cell MC1 is high data, the voltage of the second node NO2 may decrease, and when the data of the memory cell MC2 is low data, the voltage of the second node NO2 may increase.

The amplification unit 410 may include a PMOS transistor P1, a PMOS transistor P2, an NMOS transistor N1, and an NMOS transistor N2. The PMOS transistor P1 may be coupled between the pull-up power supply voltage (RTO) terminal and the first node NO1 and turned on or off in response to the voltage of the second external node EX2. The PMOS transistor P2 may be coupled between the pull-up power supply voltage (RTO) terminal and the second node NO2, and turned on or off in response to the voltage of the first external node EX1. The NMOS transistor N1 may be coupled between the pull-down power supply voltage (SB) terminal and the first node NO1, and turned on or off in response to the voltage of the second external node EX2. The NMOS transistor N2 may be coupled between the pull-down power supply voltage (SB) terminal and the second node NO2, and turned on or off in response to the voltage of the first external node EX1.

The switching unit 420 may electrically couple the first external node EX1 to the first node NO1 and electrically couple the second external node EX2 to the second node NO2, after a predetermined time elapses from when the memory cell is selected. The switching unit 420 may include a switch N3 and a switch N4. The switch N3 may be coupled between the first external node EX1 and the first node NO1 and turned on or off in response to a switching signal SW, and the switch N4 may be coupled between the second external node EX2 and the second node NO2 and turned on or off in response to the switching signal SW. The switching signal SW may be activated after the predetermined time elapses from when the memory cell is selected, that is, when the word line is activated.

The equalizing unit 430 may equalize the voltages of the bit line and bit line bar BL and BLB to the precharge voltage VBLP during a precharge period in which the data of the bit lines are not sensed and amplified. The equalizing unit 430 may include transistors N5 to N7. The transistors N5 to N7 may be turned on or off in response to the equalizing signal BLEQ. The equalizing signal BLEQ may be activated at the precharge period in which the data of the bit line are not sensed and amplified.

In FIG. 4, when a memory cell is selected, the voltage of the bit line BL or the bit line bar BLB may be changed by charge sharing between the selected memory cell and the bit line. When the amplification unit 410 is activated, the first and second nodes NO1 and NO2 may be pull-up or pull-down driven in response to the potential difference between the bit line and bit line bar BL and BLB. Thus, the potential difference between the first and second nodes NO1 and NO2 may be generated and amplified.

Since the first and second nodes NO1 and NO2 have smaller capacitance than the bit line and bit line bar BL and BLB, the potential difference may be rapidly amplified through the pull-up or pull-down driving. When the first and second nodes NO1 and NO2 are electrically coupled to the bit line and bit line bar BL and BLB after the predetermined time elapses from when the memory cell is selected, the amplification unit 410 may pull-up or pull-down drive the bit line and bit line bar BL and BLB through the first and second nodes NO1 and NO2 and amplify the potential difference between the bit line and bit line bar BL and BLB.

The data sense amplifier may generate and amplify the potential difference between the first and second nodes NO1 and NO2 having smaller capacitance before the potential difference between the bit line and bit line bar BL and BLB is amplified through the amplification unit 410, and electrically couple the first and second nodes NO1 and NO2 to the bit line and bit line bar BL and BLB where there is sufficient margin to secure the potential difference between the bit line and bit line bar BL and BLB, thereby stably amplifying the potential difference between the bit line and bit line bar BL and BLB.

Thus, although the capacitor has small capacitance or the bit line has large capacitance, the data sense amplifier may stably amplify the data of the bit line and bit line bar. As a result, since a larger number of memory cells may be integrated into the cell mat, it is possible to reduce the area of the circuit.

In the present embodiment, an example in which the memory cell MC1 corresponding to the bit line BL is selected has been described. However, even when the memory cell MC2 corresponding to the bit line bar BLB is selected, the data of the bit line and bit line bar BL and BLB may be amplified through the same process.

Figure 5A:
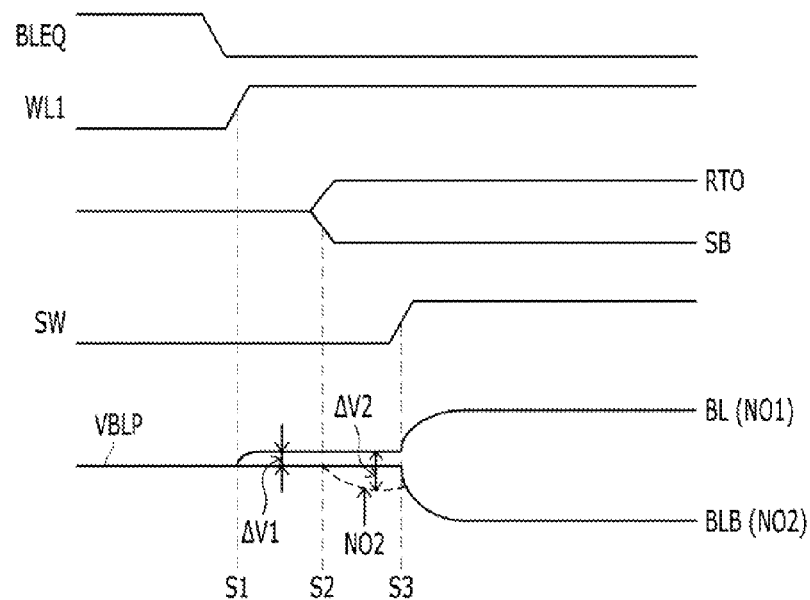
FIGS. 5A and 5B are waveform diagrams describing operations of the data sense amplifier illustrated in FIG. 4.
Figure 5B:
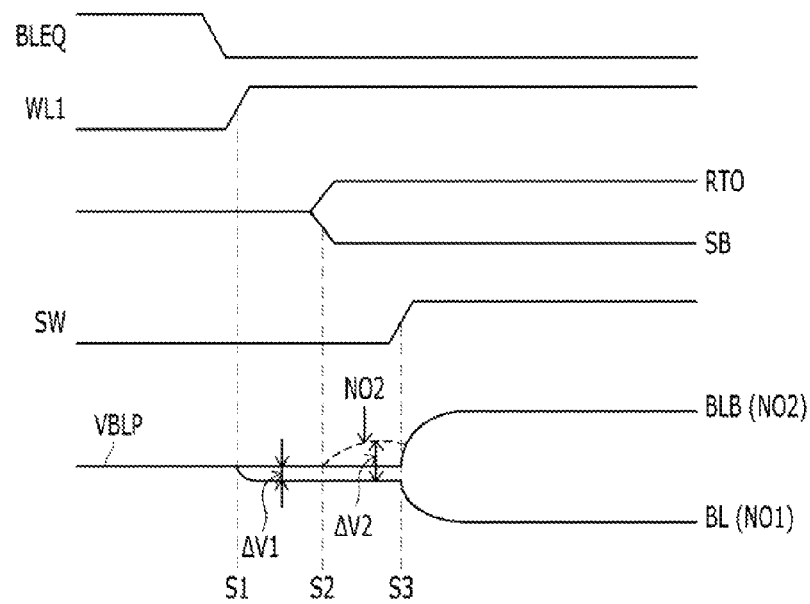

FIGS. 5A and 5B are waveform diagrams describing operations of the data sense amplifier illustrated in FIG. 4.

FIG. 5A is a waveform diagram describing an operation of the data sense amplifier when the data of the selected memory cell MC1 is high data, and FIG. 5B is a waveform diagram describing an operation of the data sense amplifier when the data of the selected memory cell MC1 is low data.

In FIGS. 5A and 5B, the voltage of the first node NO1 may be equal to the voltage of the bit line BL, and the voltage of the second node NO2 may be equal to the voltage of the bit line bar BLB, except for a portion indicated by a dotted line.

Referring to FIG. 5A, the operation of the data sense amplifier when the data of the memory cell MC1 is high data will be described. While the equalizing signal BLEQ is activated to a high level, the voltages of the bit line and bit line bar BL and BLB may be equalized to the precharge voltage VBLP. When the equalizing signal BLEQ is deactivated for a data sensing and amplification operation, the bit line and bit line bar BL and BLB may be electrically isolated from each other. When the word line WL1 is activated at timing S1, the memory cell MC1 may be selected to cause charge sharing between the bit line BL and the memory cell MC1, and the voltage of the bit line BL may increase to cause a potential difference ΔV1 between the bit line and bit line bar BL and BLB. Then when the pull-up power supply voltage RTO increases and the pull-down power supply voltage SB decreases at timing S2, the voltage of the second node NO2 may be decreased by the increase in voltage of the bit line BL. Thus, a potential difference ΔV2 between the first and second nodes NO1 and NO2 may be generated and amplified. When the switching signal SW is activated at timing S3, the potential difference ΔV1 between the bit line and bit line bar BL and BLB may be amplified. Then, the voltage of the bit line BL may increase, and the voltage of the bit line bar BLB may decrease.

Referring to FIG. 5B the operation of the data sense amplifier when the data of the memory cell MC1 is low data will be described. When the word line WL1 is activated at timing S1, the memory cell MC1 may be selected, and the voltage of the bit line BL may decrease to generate a potential difference ΔV1 between the bit line and bit line bar BL and BLB. Then, when the pull-up power supply voltage RTO increases and the pull-down power supply voltage SB decreases at timing S2, the voltage of the second node NO2 may be increased by the decrease in voltage of the bit line BL. Thus, a potential difference ΔV2 between the first and second nodes NO1 and NO2 may be generated and amplified. When the switching signal SW is activated at timing S3, the potential difference ΔV1 between the bit line and bit line bar BL and BLB may be amplified. Then, the voltage of the bit line BL may decrease, and the voltage of the bit line bar BLB may increase.

At this time, before the potential difference ΔV1 between the bit line and bit line bar BL and BLB is amplified, the potential difference ΔV2 between the first and second nodes NO1 and NO2 may be secured to compensate for a difference between the capacitance of the cell capacitor and the capacitance of the bit line.

Figure 6:
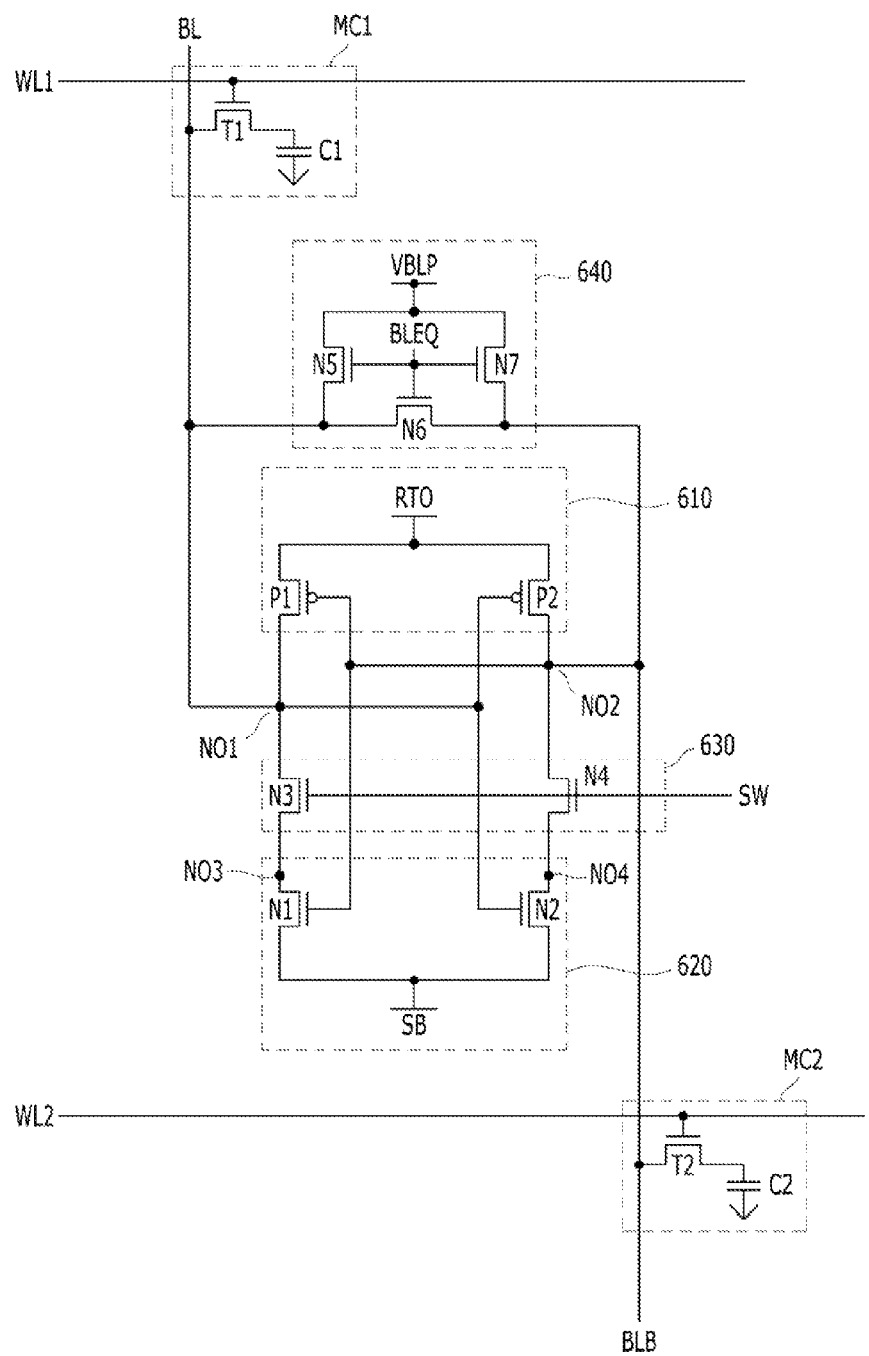
FIG. 6 is a configuration diagram of a data sense amplifier in accordance with an embodiment of the present invention.

FIG. 6 is a configuration diagram of a data sense amplifier in accordance with an embodiment of the present invention.

Referring to FIG. 6, the data sense amplifier may include first and second nodes NO1 and NO2, a pull-up amplification unit 610, a pull-down amplification unit 620, and a switching unit 630. The first node NO1 may be coupled to a bit line BL, and the second node NO2 may be coupled to a bit line bar BLB. Thus, voltages of the bit line BL and the first node NO1 may be equal to each other, and voltages of the bit line bar BLB and the second node NO2 may be equal to each other. The equalizing unit 640 may be configured and operated in the same manner as the equalizing unit 430 described with reference to FIG. 4.

Between the bit line and bit line bar BL and BLB and word lines WL1 and WL2, memory cells MC1 and MC2 may be respectively coupled. That is, each of the memory cells MC1 and MC2 may correspond to one word line and one bit line among the word lines WL1 and WL2 and the bit line and bit line bar BL and BLB. The memory cells MC1 and MC2 may include cell transistors T1 and T2 and cell capacitors C1 and C2, respectively.

The process in which a memory cell is selected to generate a potential difference between the bit line and bit line bar BL and BLB may be performed in the same manner as described with reference to FIG. 4. In the following descriptions, an example in which the memory cell MC1 coupled to the word line WL1 and the bit line BL is selected will be taken as an example.

When a pull-up power supply voltage RTO is supplied, the pull-up amplification unit 610 may amplify a potential difference between the bit line and bit line bar BL and BLB by pull-up driving the bit line and bit line bar BL and BLB in response to the potential difference between the bit line and bit line bar BL and BLB. When the voltage of the bit line BL increases, the pull-up amplification unit 610 may further increase the voltage of the bit line BL by pull-up driving the bit line BL to the pull-up power supply voltage RTO. Furthermore, when the voltage of the bit line BL decreases, the pull-up amplification unit 610 may increase the voltage of the bit line bar BLB by pull-up driving the bit line bar BLB to the pull-up power supply voltage RTO.

The pull-up amplification unit 610 may include a PMOS transistor P1 and a PMOS transistor P2. The PMOS transistor P1 may be coupled between the pull-up power supply voltage (RTO) terminal and the first node NO1 and turned on or off in response to the voltage of the second node NO2 and the PMOS transistor P2 may be coupled between the pull-up power supply voltage (RTO) terminal and the second node NO2 and turned on or off in response to the voltage of the first node NO1.

The switching unit 630 may electrically couple the first and second nodes NO1 and NO2 to third and fourth nodes NO3 and NO4, respectively, after a predetermined time elapses from when the memory cell is selected. The switching unit 630 may include an NMOS transistor N3 and an NMOS transistor N4. The NMOS transistor N3 may be coupled between the first node NO1 and the third node NO3 and turned on or off in response to a switching signal SW, and the NMOS transistor N4 may be coupled between the second node NO2 and the fourth node NO4 and turned on or off in response to the switching signal SW. The switching signal SW may be activated after the predetermined time elapses from when the memory cell is selected.

When a pull-down power supply voltage SB is supplied and the third and fourth nodes NO3 and NO4 are electrically coupled to the first and second nodes NO1 and NO2, respectively, the pull-down amplification unit 620 may amplify a potential difference between the bit line and bit line bar BL and BLB by pull-down driving the bit line and bit line bar BL and BLB in response to the potential difference between the bit line and bit line bar BL and BLB. At this time, the pull-down amplification unit 620 may pull-down drive the bit line and bit line bar BL and BLB through the third and fourth nodes NO3 and NO4.

When the voltage of the bit line BL is higher than the voltage of the bit line bar BLB, the pull-down amplification unit 620 may decrease the voltage of the bit line bar BLB by pull-down driving the bit line bar BLB to the pull-down power supply voltage SB. Furthermore, when the voltage of the bit line bar BLB is higher than the voltage of the bit line BL, the pull-down amplification unit 620 may decrease the voltage of the bit line BL by pull-down driving the bit line BL to the pull-down power supply voltage SB.

The pull-down amplification unit 620 may include an NMOS transistor N1 and an NMOS transistor N2. The NMOS transistor may be coupled between the pull-down power supply voltage (SB) terminal and the third node NO3 and turned on or off in response to the voltage of the second node NO2 and the NMOS transistor N2 may be coupled between the pull-down power supply voltage (SB) terminal and the fourth node NO4 and turned on or off in response to the voltage of the first node NO1.

In the present embodiment, an example in which the memory cell MC1 corresponding to the bit line BL is selected has been described. However, even when the memory cell MC2 corresponding to the bit line bar BLB is selected, the data of the bit line and bit line bar BL and BLB may be amplified through the same process.

Figure 7A:
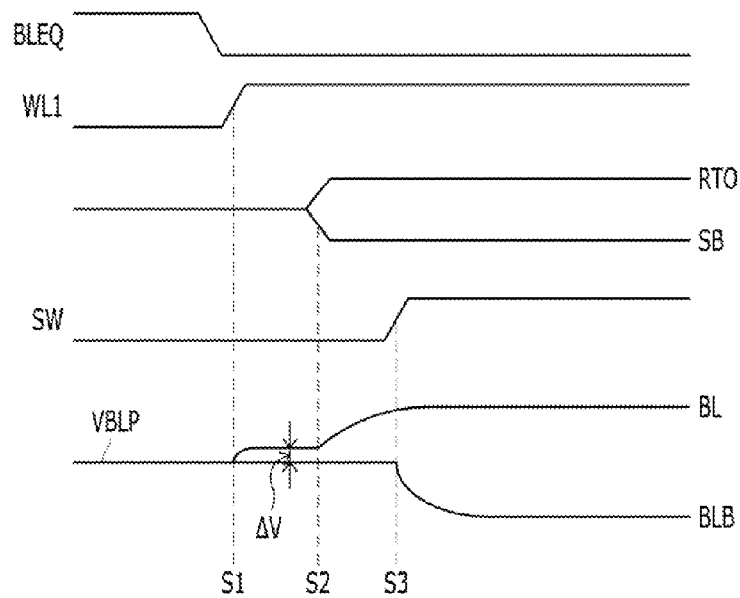
FIGS. 7A and 7B are waveform diagrams describing operations of the data sense amplifier illustrated in FIG. 6.

FIGS. 7A and 5B are waveform diagrams describing operations of the data sense amplifier illustrated in FIG. 6.

Figure 7B:
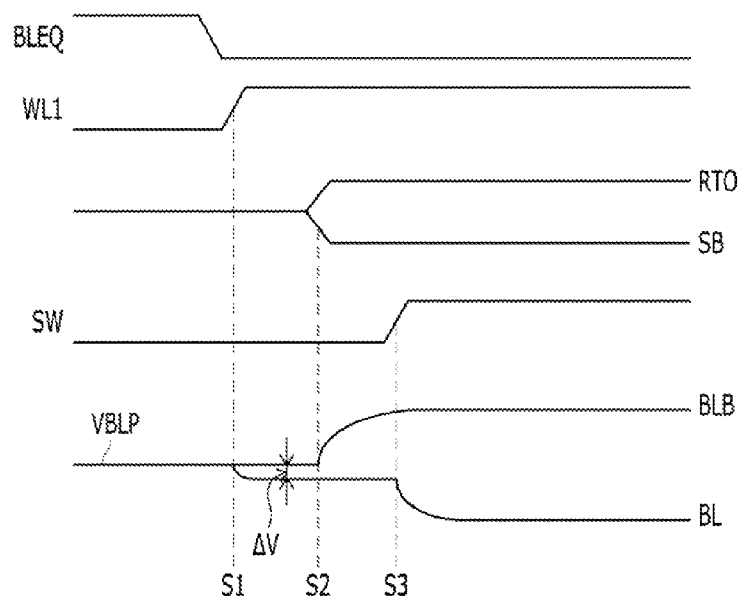

FIG. 7A is a waveform diagram describing an operation of the data sense amplifier when the data of the selected memory cell MC1 is high data, and FIG. 7B is a waveform diagram describing an operation of the data sense amplifier when the data of the selected memory cell MC1 is low data.

Referring to FIG. 7A, the operation of the data sense amplifier when the data of the memory cell MC1 is high data will be described. While an equalizing signal BLEQ is activated to a high level, the voltages of the bit line and bit line bar BL and BLB may be equalized to a precharge voltage VBLP. When the equalizing signal BLEQ is deactivated for a data sensing and amplification operation, the bit line and bit line bar BL and BLB may be electrically isolated from each other. When the word line WL1 is activated at timing S1, the memory cell MC1 may be selected, and the voltage of the bit line BL may increase to cause a potential difference ΔV between the bit line and bit line bar BL and BLB. Then, when the pull-up power supply voltage RTO increases and the pull-down power supply voltage SB decreases at timing S2, the bit line BL may be pull-up driven by the increase in voltage of the bit line BL. Thus, the voltage of the bit line BL may further increase. When the switching signal SW is activated at timing S3, the bit line and bit line bar BL and BLB may respectively be pull-up and pull-down driven to amplify the potential difference between the bit line and bit line bar BL and BLB. Then, the voltage of the bit line BL may increase, and the voltage of the bit line bar BLB may decrease.

Referring to FIG. 7B, the operation of the data sense amplifier when the data of the memory cell MC1 is low data will be described. When the word line WL1 is activated at timing S1, the memory cell MC1 may be selected, and the voltage of the bit line BL may decrease to cause a potential difference ΔV between the bit line and bit line bar BL and BLB. Then, when the pull-up power supply voltage RTO increases and the pull-down power supply voltage SB decreases at timing S2, the bit line bar BLB may be pull-up driven by the decrease in voltage of the bit line BL. Thus, the voltage of the bit line bar BLB may increase. When the switching signal SW is activated at timing S3, the bit line and bit line bar BL and BLB may be respectively pull-down and pull-up driven to amplify the potential difference between the bit line and bit line bar BL and BLB. Then, the voltage of the bit line BL may decrease, and the voltage of the bit line bar BLB may increase.

At this time, before the potential difference between the bit line and bit line bar BL and BLB is amplified through the pull-up and pull-down driving, a bit line having the higher voltage between the bit line and bit line bar BL and BLB may be pull-up driven to secure a larger potential difference, thereby compensating for a difference between the capacitance of the cell capacitor and the capacitance of the bit line.

Figure 8:
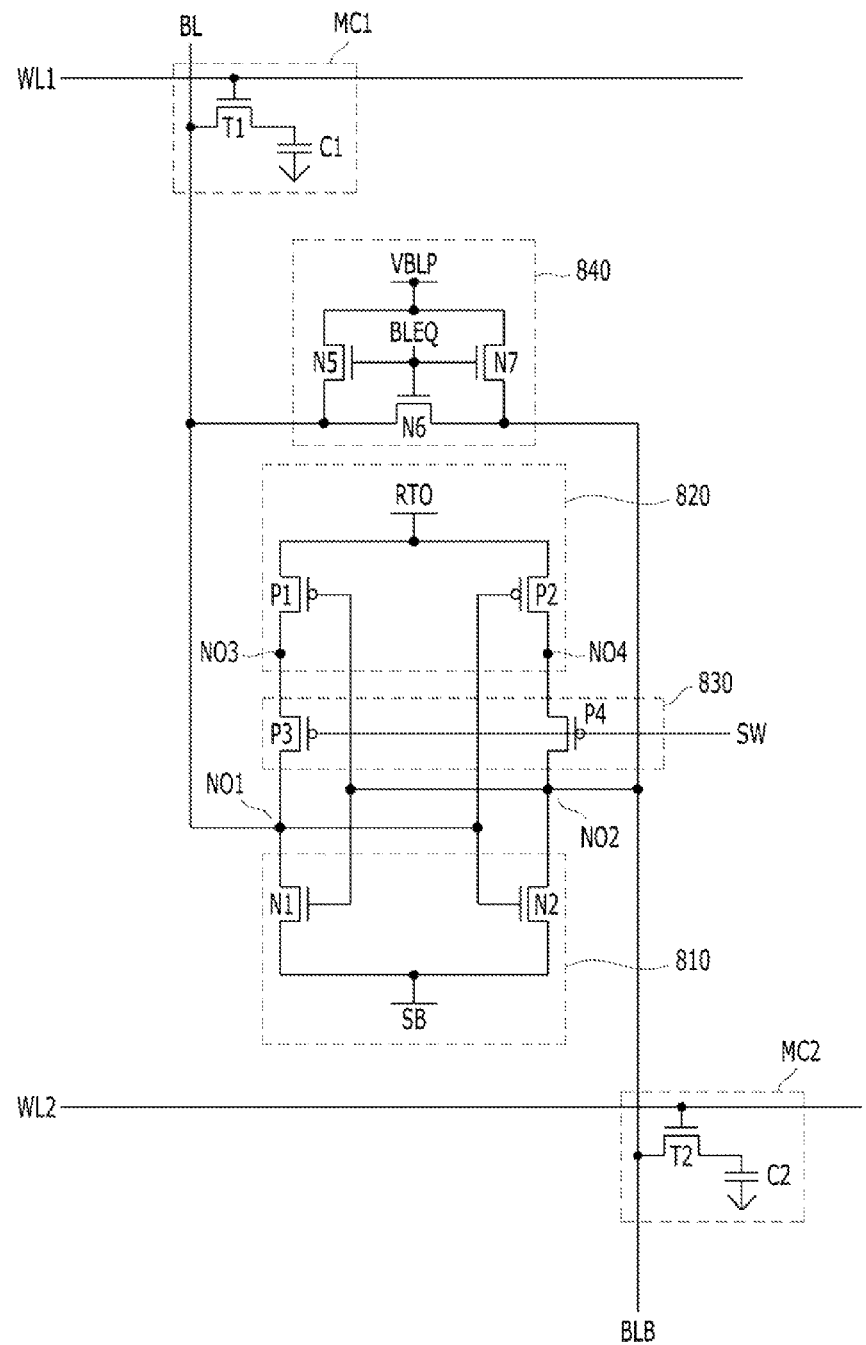
FIG. 8 is a configuration diagram of a data sense amplifier in accordance with an embodiment of the present invention.

FIG. 8 is a configuration diagram of a data sense amplifier in accordance with an embodiment of the present invention.

Referring to FIG. 8, the data sense amplifier may include first and second nodes NO1 and NO2, a pull-down amplification unit 810, a pull-up amplification unit 820, and a switching unit 830. The first node NO1 may be coupled to a bit line BL, and the second node NO2 may be coupled to a bit line bar BLB. Thus, voltages of the bit line BL and the first node NO1 may be equal to each other, and voltages of the bit line bar BLB and the second node NO2 may be equal to each other. The equalizing unit 840 may be configured and operated in the same manner as the equalizing unit 430 described with reference to FIG. 4.

The process in which a memory cell is selected to generate a potential difference between the bit line and bit line bar BL and BLB may be performed in the same manner as described with reference to FIG. 4. Hereafter, an example in which the memory cell MC1 coupled to the word line WL1 and the bit line BL is selected will be described.

When a pull-down power supply voltage SB is supplied, the pull-down amplification unit 810 may amplify a potential difference between the bit line and bit line bar BL and BLB by pull-down driving the bit line and bit line bar BL and BLB in response to the potential difference between the bit line and bit line bar BL and BLB. When the voltage of the bit line BL increases, the pull-down amplification unit 810 may decrease the voltage of the bit line bar BLB by pull-down driving the bit line bar BLB to the pull-down power supply voltage SB. Furthermore, when the voltage of the bit line BL decreases, the pull-down amplification unit 810 may further decrease the voltage of the bit line BL by pull-down driving the bit line BL to the pull-down power supply voltage SB.

The pull-down amplification unit 810 may include an NMOS transistor N1 and an NMOS transistor N2. The NMOS transistor N1 may be coupled between the pull-down power supply voltage (SB) terminal and the first node NO1 and turned on or off in response to the voltage of the second node NO2, and the NMOS transistor N2 may be coupled between the pull-down power supply voltage (SB) terminal and the second node NO2 and turned on or off in response to the voltage of the first node NO1.

The switching unit 830 may electrically couple the first and second nodes NO1 and NO2 to third and fourth nodes NO3 and NO4, respectively, after a predetermined time elapses from when the memory cell is selected. The switching unit 830 may include a PMOS transistor P3 and a PMOS transistor P4. The PMOS transistor P3 may be coupled between the first node NO1 and the third node NO3 and turned on or off in response to a switching signal SW, and the PMOS transistor P4 may be coupled between the second node NO2 and the fourth node NO4 and turned on or off in response to the switching signal SW. The switching signal SW may be activated to a low level after the predetermined time elapses from when the memory cell is selected.

When a pull-up power supply voltage RTO is supplied and the third and fourth nodes NO3 and NO4 are electrically coupled to the first and second nodes NO1 and NO2, respectively, the pull-up amplification unit 820 may amplify a potential difference between the bit line and bit line bar BL and BLB by pull-up driving the bit line and bit line bar BL and BLB in response to the potential difference between the bit line and bit line bar BL and BLB. At this time, the pull-up amplification unit 820 may pull-up drive the bit line and bit line bar BL and BLB through the third and fourth nodes NO3 and NO4.

When the voltage of the bit line BL is higher than the voltage of the bit line bar BLB, the pull-up amplification unit 820 may increase the voltage of the bit line BL by pull-up driving the bit line BL to the pull-up power supply voltage RTO. Furthermore, when the voltage of the bit line bar BLB is higher than the voltage of the bit line BL, the pull-up amplification unit 820 may increase the voltage of the bit line bar BLB by pull-up driving the bit line bar BLB to the pull-up power supply voltage RTO.

The pull-up amplification unit 820 may include a PMOS transistor P1 and a PMOS transistor P2. The PMOS transistor P1 may be coupled between the pull-up power supply voltage (RTO) terminal and the third node NO3 and turned on or off in response to the voltage of the second node NO2, and the PMOS transistor P2 may be coupled between the pull-up power supply voltage (RTO) terminal and the fourth node NO4 and turned on or off in response to the voltage of the first node NO1.

In the present embodiment, an example in which the memory cell MC1 corresponding to the bit line BL is selected has been described. However, even when the memory cell MC2 corresponding to the bit line bar BLB is selected, the data of the bit line and bit line bar BL and BLB may be amplified through the same process.

Figure 9A:
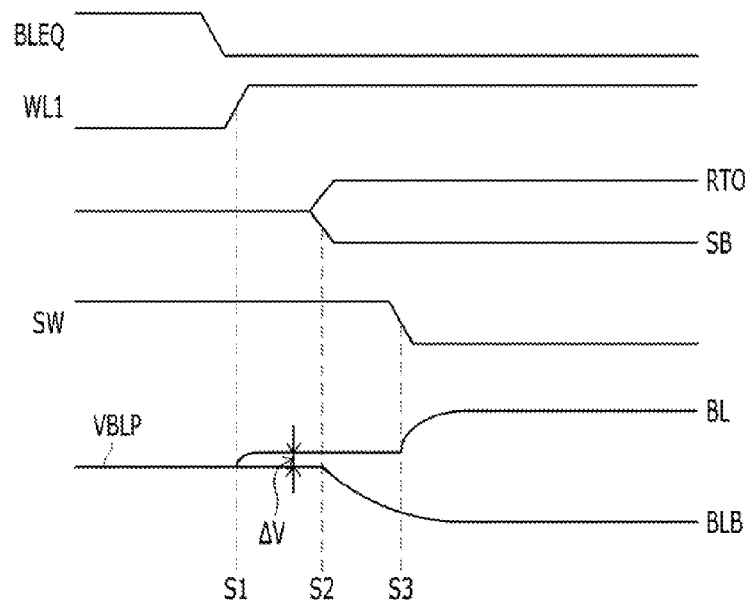
FIGS. 9A and 9B are waveform diagrams describing operations of the data sense amplifier illustrated in FIG. 8.
Figure 9B:
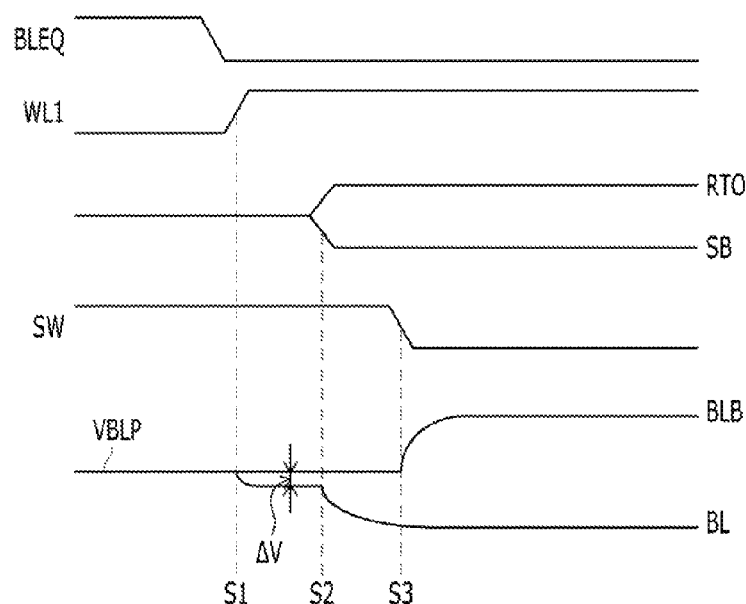

FIGS. 9A and 9B are waveform diagrams describing operations of the data sense amplifier illustrated in FIG. 8.

FIG. 9A is a waveform diagram describing an operation of the data sense amplifier when the data of the selected memory cell MC1 is high data, and FIG. 9B is a waveform diagram describing an operation of the data sense amplifier when the data of the selected memory cell MC1 is low data.

Referring to FIG. 9A, the operation of the data sense amplifier when the data of the memory cell MC1 is high data will be described. While an equalizing signal BLEQ is activated to a high level, the voltages of the bit line and bit line bar BL and BLB may be equalized to a precharge voltage VBLP. When the equalizing signal BLEQ is deactivated for a data sensing and amplification operation, the bit line and bit line bar BL and BLB may be electrically isolated from each other. When the word line WL1 is activated at timing S1, the memory cell MC1 may be selected, and the voltage of the bit line BL may increase to cause a potential difference ΔV between the bit line and bit line bar BL and BLB. Then, when the pull-up power supply voltage RTO increases and the pull-down power supply voltage SB decreases at timing S2, the bit line bar BLB may be pull-down driven by the increase in voltage of the bit line BL. Thus, the voltage of the bit line bar BLB may decrease. When the switching signal SW is activated at timing S3, bit line and bit line bar BL and BLB may be respectively pull-up and pull-down driven to amplify the potential difference between the bit line and bit line bar BL and BLB. Then, the voltage of the bit line BL may increase, and the voltage of the bit line bar BLB may be decrease.

Referring to FIG. 9B, the operation of the data sense amplifier when the data of the memory cell MC1 is low data will be described. When the word line WL1 is activated at timing S1, the memory cell MC1 may be selected, and the voltage of the bit line BL may decrease to cause a potential difference ΔV between the bit line and bit line bar BL and BLB. Then, when the pull-up power supply voltage RTO increases and the pull-down power supply voltage SB decreases at timing S2, the bit line BL may be pull-down driven by the increase in voltage of the bit line BL. Thus, the voltage of the bit line BL may further decrease. When the switching signal SW is activated at timing S3, the bit line and bit line bar BL and BLB may be respectively pull-down and pull-up driven to amplify the potential difference between the bit line and bit line bar BL and BLB. Then, the voltage of the bit line BL may decrease, and the voltage of the bit line bar BLB may increase.

At this time, before the potential difference between the bit line and bit line bar BL and BLB is amplified through the pull-up and pull-down driving, a bit line having the lower voltage between the bit line and bit line bar BL and BLB may be pull-down driven to secure a larger potential difference, thereby compensating for a difference between the capacitance of the cell capacitor and the capacitance of the bit line.

Figure 10:
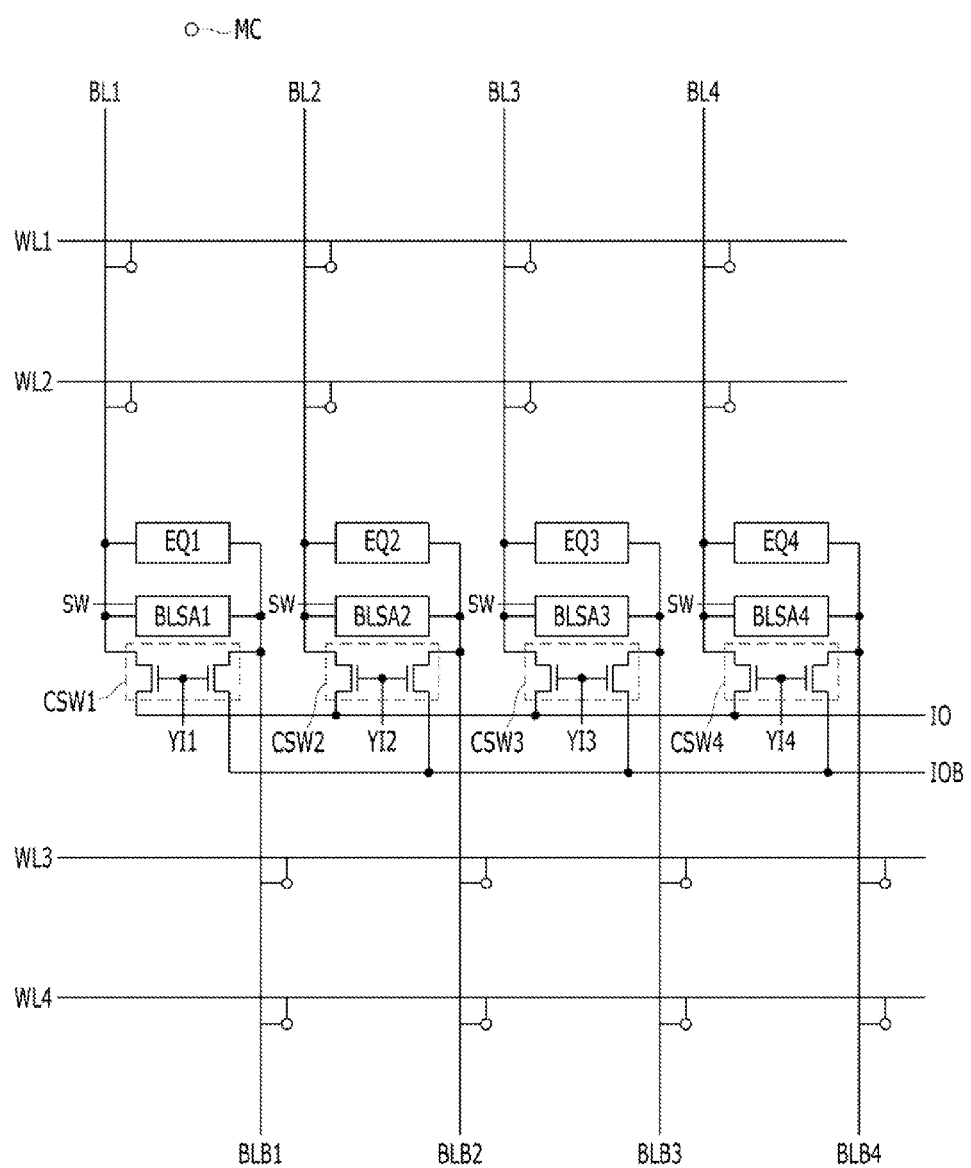
FIG. 10 is a configuration diagram of a semiconductor device in accordance with an embodiment of the present invention.

FIG. 10 is a configuration diagram of a semiconductor device in accordance with an embodiment of the present invention.

Referring to FIG. 10, the memory device may include a plurality of word lines WL1 to WL4, a plurality of bit line pairs BL1/BLB1 to BL4/BLB4, a plurality of memory cells MC, a plurality of bit line sense amplifiers BLSA1 to BLSA4, and a plurality of equalizing units EQ1 to EQ4.

When a word line is activated, charge sharing may occur while any one of a bit line and bit line bar of a bit line pair is electrically coupled to a memory cell MC. Then, a voltage of the bit line may be changed to cause a potential difference between the bit line pair.

The equalizing units EQ1 to EQ4 may be configured and operated in the same manner as the equalizing unit 430 of FIG. 4. The equalizing units EQ1 to EQ4 may equalize the voltages of the bit line and bit line bar of the bit line pair to a precharge voltage VBLP during a precharge period.

Each of the plurality of bit line sense amplifiers BLSA1 to BLSA4 may correspond to one of the bit line pairs BL1/BLB1 to BL4/BL4. The plurality of bit line sense amplifiers BLSA1 to BLSA4 may amplify data of the corresponding bit line pairs BL1/BLB1 to BL4/BL4. More specifically, the plurality of bit line sense amplifiers BLSA1 to BLSA4 may amplify potential differences of the corresponding bit line pairs BL1/BLB1 to BL4/BL4.

The plurality of bit line sense amplifiers BLSA1 to BLSA4 may be implemented with any one of the data sense amplifiers of FIGS. 4, 6, and 8. When the bit line sense amplifiers BLSA1 to BLSA4 are implemented with the data sense amplifier of FIG. 4, each of the bit line sense amplifiers BLSA1 to BLSA4 may generate and amplify a potential difference between the first and second nodes NO1 and NO2 in response to the potential difference between the corresponding bit line pair among the bit line pairs BL1/BLB1 to BL4/BL4, when a word line is activated. Then, after a predetermined time elapses from when the word line is activated, the bit line sense amplifier may electrically couple the first and second nodes NO1 and NO2 to the corresponding bit line pair.

When the bit line sense amplifiers BLSA1 to BLSA4 are implemented with the data sense amplifier of FIG. 6, each of the bit line sense amplifiers BLSA1 to BLSA4 may generate and amplify a potential difference between the corresponding bit line pair among the bit line pairs BL1/BLB1 to BL4/BL4 by driving the corresponding bit line pair in response to the potential difference between the corresponding bit line pair, when a word line is activated. Then, after a predetermined time elapses from when the word line is activated, the bit line sense amplifier may amplify the potential difference between the corresponding bit line pair by pull-up and pull-down driving the corresponding bit line pair in response to the potential difference between the corresponding bit line pair.

When the bit line sense amplifiers BLSA1 to BLSA4 are implemented with the data sense amplifier of FIG. 8, each of the bit line sense amplifiers BLSA1 to BLSA4 may amplify a potential difference between the corresponding bit line pair among the bit line pairs BL1/BLB1 to BL4/BL4 by pull-down driving the corresponding bit line pair in response to the potential difference between the corresponding bit line pair, when a word line is activated. Then, after a predetermined time elapses from when the word line is activated, the bit line sense amplifier may amplify the potential difference between the corresponding bit line pair by pull-up and pull-down driving the corresponding bit line pair in response to the potential difference between the corresponding bit line pair.

The memory device may further include column select switches CSW1 to CSW4. The column select switches CSW1 to CSW4 may electrically couple the corresponding bit line pairs BL1/BLB1 to BL4/BLB4 to an input line pair IO/IOB, when respective column select signals YI1 to YI4 are activated. Through this operation, data may be transmitted from the bit line pairs BL1/BLB1 to BL4/BLB4 to the input line pair IO/IOB.

In accordance with the embodiments of the present invention, the data sense amplifier may amplify data of a bit line pair after a predetermined time elapses from when a memory cell and a bit line are electrically coupled, thereby increasing cell gnat integration while sufficiently securing a sensing margin.

Although various embodiments have been described for illustrative purposes, it will be apparent to those skilled in the art that various changes and modifications may be made without departing from the spirit and scope of the invention as defined in the following claims.

What is claimed is:
1. A data sense amplifier comprising:
first and second nodes configured to be coupled to a bit line and a bit line bar, respectively;
a first amplification unit configured to amplify a potential difference between first and second nodes by a first driving of the first and second nodes in response to the potential difference between the first and second nodes;
a second amplification unit configured to amplify the potential difference between the first and second nodes by a second driving of a third and a fourth node in response to the potential difference between the first and second nodes, when the first and second nodes are electrically coupled to the third and fourth nodes; and
a switching unit configured to electrically couple the first and second nodes to third and fourth nodes, respectively, after a predetermined time elapses from when the first and second amplification units are activated after a memory cell is selected,
wherein a potential difference occurs between the first and second nodes when a memory cell is selected,
wherein the first driving comprises a pull-up driving, and the second driving comprises a pull-down driving,
wherein the first amplification unit comprises:
a first PMOS transistor coupled between a pull-up power supply voltage terminal and the first node, and turned on/off in response to a voltage of the second node; and
a second PMOS transistor coupled between the pull-up power supply voltage terminal and the second node, and turned on/off in response to a voltage of the first node,
wherein the second amplification unit comprises:
a first NMOS transistor coupled between a pull-down power supply voltage terminal and a third node, and turned on/off in response to the voltage of the second node; and
a second NMOS transistor coupled between the pull-down power supply voltage terminal and a fourth node, and turned on/off in response to the voltage of the first node,
wherein the switching unit comprises:
a third NMOS transistor coupled between the first node and the third node, and turned on/off in response to a switching signal which is activated after the predetermined time elapses from when the first and second amplification units are activated after the memory cell is selected; and
a fourth NMOS transistor coupled between the second node and the fourth node, and turned on/off in response to the switching signal,
wherein the first node is positioned between and directly coupled to both the first PMOS transistor of the first amplification unit and the third NMOS transistor of the switching unit,
the third node is positioned between and directly coupled to both the third NMOS transistor of the switching unit and the first NMOS transistor of the second amplification unit,
the second node is positioned between and directly coupled to both the second PMOS transistor of the first amplification unit and the fourth NMOS transistor of the switching unit, and
the fourth node is positioned between and directly coupled to both the fourth NMOS transistor of the switching unit and the second NMOS transistor of the second amplification unit.
2. The data sense amplifier of claim 1, wherein when the selected memory cell is coupled to the first node, a voltage of the first node increases or decreases based on data of the selected memory cell, and
when the selected memory cell is coupled to the second node, a voltage of the second node increases or decreases based on the data of the selected memory cell.
3. A data sense amplifier comprising:
first and second nodes configured to be coupled to a bit line and a bit line bar, respectively;
a first amplification unit configured to amplify a potential difference between first and second nodes by a first driving of the first and second nodes in response to the potential difference between the first and second nodes;
a second amplification unit configured to amplify the potential difference between the first and second nodes by a second driving of a third and a fourth node in response to the potential difference between the first and second nodes, when the first and second nodes are electrically coupled to the third and fourth nodes; and a switching unit configured to electrically couple the first and second nodes to third and fourth nodes, respectively, after a predetermined time elapses from when the first and second amplification units are activated after a memory cell is selected, wherein a potential difference occurs between the first and second nodes when a memory cell is selected, wherein the first driving comprises a pull-down driving, and the second driving comprises a pull-up driving, wherein the first amplification unit comprises:
- a first NMOS transistor coupled between a pull-down power supply voltage terminal and the first node, and turned on/off in response to a voltage of the second node; and
- a second NMOS transistor coupled between the pull-down power supply voltage terminal and the second node, and turned on/off in response to a voltage of the first node, wherein the second amplification unit comprises:
- a first PMOS transistor coupled between a pull-up power supply voltage terminal and the third node, and turned on/off in response to the voltage of the second node; and
- a second PMOS transistor coupled between the pull-up power supply voltage terminal and the fourth node, and turned on/off in response to the voltage of the first node, wherein the switching unit comprises:
- a third PMOS transistor coupled between the first node and the third node, and turned on/off in response to a switching signal which is activated after the predetermined time elapses from when the first and second amplification units are activated after the memory cell is selected; and
- a fourth PMOS transistor coupled between the second node and the fourth node, and turned on/off in response to the switching signal, wherein the first node is positioned between and directly coupled to both the first NMOS transistor of the first amplification unit and the third PMOS transistor of the switching unit, the third node is positioned between and directly coupled to both the third PMOS transistor of the switching unit and the first PMOS transistor of the second amplification unit, the second node is positioned between and directly coupled to both the second NMOS transistor of the first amplification unit and the fourth PMOS transistor of the switching unit, and the fourth node is positioned between and directly coupled to both the fourth PMOS transistor of the switching unit and the second PMOS transistor of the second amplification unit.

* * * * *